United States Patent [19]

Mizutani

[11] Patent Number: 5,572,288
[45] Date of Patent: Nov. 5, 1996

[54] EXPOSURE APPARATUS WITH VARIABLE ALIGNMENT OPTICAL SYSTEM

[75] Inventor: Hideo Mizutani, Yokohama, Japan

[73] Assignee: Nikon Corporation, Japan

[21] Appl. No.: 358,223

[22] Filed: Dec. 16, 1994

[30] Foreign Application Priority Data

Dec. 16, 1993 [JP] Japan .................................. 5-317031
Dec. 28, 1993 [JP] Japan .................................. 5-334499

[51] Int. Cl.$^6$ .............................................. H01L 21/027
[52] U.S. Cl. ............................ 355/53; 250/548; 356/401
[58] Field of Search ....................... 355/53, 67; 250/548; 356/400, 401; 362/268

[56] References Cited

U.S. PATENT DOCUMENTS

| | | | |
|---|---|---|---|
| 4,801,208 | 1/1989 | Katoh et al. | 356/401 |
| 4,851,978 | 7/1989 | Ichihara | 362/268 |
| 4,939,630 | 7/1990 | Kikuchi et al. | 362/268 |
| 4,962,318 | 10/1990 | Nishi | 250/548 |
| 5,118,953 | 6/1992 | Ota et al. | 250/548 |
| 5,138,176 | 8/1992 | Nishi | 250/548 |
| 5,214,489 | 5/1993 | Mizutani | 356/363 |
| 5,237,367 | 8/1993 | Kudo | 355/67 |
| 5,245,384 | 9/1993 | Mori | 355/67 |
| 5,272,501 | 12/1993 | Nishi et al. | 355/53 |

FOREIGN PATENT DOCUMENTS 4-25111(A) 1/1992 Japan .
5-160001(A) 6/1993 Japan .

*Primary Examiner*—Joan H. Pendegrass
*Attorney, Agent, or Firm*—Pennie & Edmonds

[57] ABSTRACT

An exposure apparatus according to the present invention comprises a projection optical system for transferring a pattern of an image on a mask onto a photosensitive substrate, a plurality of alignment optical systems for independently detecting a plurality of alignment marks provided at least on said mask and detecting associated alignment marks through respective objective lenses provided corresponding thereto, and a variable optical system for obtaining a reduced image of the mask, set between a first plane on which the mask is to be located and a second plane which is parallel to the first plane and on which the objective lenses are to be located. Particularly, the variable optical system is so designed as to avoid overlap of beams entering the respective objective lenses provided for the alignment optical systems upon observation of the associated alignment marks through the respective alignment optical systems.

23 Claims, 8 Drawing Sheets the alignment optical system results in degradation of position detection accuracy of the alignment optical system.

Further, in the above exposure apparatus of the TTR method, the alignment mechanism is normally located above the reticle, i.e., in an upper portion of the apparatus. Accordingly; the size increase of the alignment optical system increases the weight of the alignment mechanism itself, thereby degrading the stability of apparatus.

The exposure apparatus according to the present invention has a structure for preventing the size increase of alignment mechanism with demands for improvement of throughput as described above. In more detail, the exposure apparatus comprises a stage for holding a photosensitive substrate (a semiconductor wafer coated with a photosensitive material such as a photoresist); an illumination optical system having a first light source for emitting exposure light of a predetermined wavelength, for transferring a predetermined pattern on a reticle (mask) onto the wafer; a projection optical system for forming a pattern image of the pattern on the reticle, on a surface of the wafer; an alignment optical system having a second light source for emitting alignment light of a predetermined wavelength, for optically detecting positions of a reticle mark and a wafer mark through an objective lens, using the alignment light; and a variable optical system for obtaining a reduced image of the reticle, provided between a first plane on which the reticle is to be located and a second plane which is a plane parallel to the first plane and on which the objective lens is to be located.

Normally, such exposure apparatus are so arranged that a plurality of alignment marks for detecting a relative positional deviation between the reticle and the wafer are provided on the reticle and on the wafer and that the objective lens and alignment optical system are prepared in a rate of at least one pair per alignment mark.

The exposure apparatus according to the present invention further comprises a detector for obtaining from the alignment optical system reference information related to the alignment light emitted from the second light source and measurement information related to reflected light of the alignment light emitted toward the reticle mark and toward the wafer mark through the objective lens and detecting a positional deviation between the reticle mark and the wafer mark, based on the reference information and measurement information; a stage driver for driving the stage so as to move the wafer in parallel with the first plane; and a control system for operating the stage driver to adjust the relative position between the reticle and the wafer, based on information of the positional deviation obtained from the detector.

An alignment mechanism according to the present invention comprises at least the above variable optical system, objective lens, alignment optical system, and detector.

In particular, as shown in FIG. 1, a first embodiment of the variable optical system 30 is a Galilean optical system comprising a positive lens group 31 set between the first plane P1 on which the reticle is to be located and the second plane P2 which is a plane parallel to the first plane and on which objective lenses are to be located, and a negative lens group 32 set between the positive lens group 31 and the second plane P2. The Galilean optical system is defined as follows.

$$h < (1-K)^{-1}\{(y/(2\beta \cdot NA)) \cdot (1-f_1/L) - (\beta^{-1}-1) \cdot f_1\}$$

$$K = y/(2\beta L \cdot NA)$$

EXPOSURE APPARATUS WITH VARIABLE ALIGNMENT OPTICAL SYSTEM

BACKGROUND OF THE INVENTION

1. Field of the Invention

The present invention relates to a projection exposure apparatus, and more particularly to an alignment mechanism used in the projection exposure apparatus and an optical system used in the alignment mechanism.

2. Related Background Art

Recently, reduction projection exposure apparatus of the step-and-repeat method (steppers) are frequently used as apparatus for transferring fine patterns onto a photosensitive substrate (a semiconductor wafer coated with a photoresist layer) with high resolution in the photolithography process. With an increase in degree of integration of semiconductor elements, it becomes necessary that the steppers of this type use shorter-wavelength exposure light and that a projection lens with higher numerical aperture (N.A.) be developed. The resolving line width has reached the submicron level (about 0.5 µm) on wafer. In order to transfer such high-resolution patterns, it is necessary to achieve positioning between a pattern on a mask or reticle (hereinafter referred to as reticle) and a shot area on a wafer with alignment accuracy matching with the resolution (normally about one fifth of the resolving line width). As an alignment method for such steppers, for example, the TTR (Through The Reticle) method is conventionally well known, which is arranged to simultaneously detect an alignment mark formed around the circuit pattern of reticle and an alignment mark formed around the shot area on wafer.

An alignment mechanism of the TTR method is so arranged that an alignment mark on reticle (hereinafter referred to as a reticle mark) and an alignment mark on wafer (hereinafter referred to as a wafer mark) both are optically detected with high accuracy to obtain a relative positional deviation amount between them and that the reticle or the wafer is finely moved to correct the deviation amount.

SUMMARY OF THE INVENTION

An object of the present invention is to obtain an exposure apparatus having a structure to realize an alignment mechanism smaller than the conventional mechanisms and enabling high-accuracy alignment.

For the exposure apparatus employing the alignment mechanism of the TTR method, the shot area (an area on wafer onto which the pattern on reticle is projected) is becoming enlarged in order to improve the throughput. This enlargement of shot area also increases the reticle size.

Namely, the above steppers are so arranged that a pattern on reticle (a predetermined pattern of circuits etc.) is reduced through a projection optical system and that the reduced pattern is transferred onto the wafer. As the size of shot area on wafer increases, the reticle size also naturally increases in proportion to a reciprocal of a reduction ratio of the projection optical system. As a result, the size also increases of an alignment optical system for detecting the reticle mark on the reticle. The size increase of alignment optical system means an increase of an optical path of the alignment optical system. The increase of optical path of the alignment optical system makes position detection of the alignment optical system sensitive to air fluctuation. Thus, the size increase of $$f_2 = -\beta f_1/(1+((h-f_1)/L))$$

$$d = f_1(1-\beta+h/L)/(1+((h-f_1)/L))$$

In the above formulas;

h: a distance between the reticle R on the first plane P1 and the pricipal plane P3 of the positive lens group 31;

y: a distance between objective lenses 42a, 42b. The objective lenses may be arranged on the second plane P2 in such a manner that optical axes of these objective lenses are coincident with each other (as shown by dashed lines in FIG. 1) with a mirror for changing an optical path between the each objective lens 42a, 42b and the negative lens group 32. In this arrangement the parameter y means a distance between the mirrors (FIG. 5).;

NA: a numerical aperture of each objective lens 42a, 42b;

$\beta$: a reduction ratio ($0<\beta<1$) of the Galilean optical system;

$f_1$: a focal length of the positive lens group 31;

$f_2$: a focal length of the negative lens group 32;

L: a distance between the reticle R and a pupil P of projection optical system 20 (as formed on a pupil plane 22). The parameter L could be set to the infinity in a design of the variable optical system.;

d: a principal plane separation between the positive lens group 31 and the negative lens group 32, which is a distance between the principal plane P3 of positive lens group 31 and the principal plane P4 of negative lens group 32. The positive and negative lens groups 31 and 32 are respectively composed of one or more lenses.

Further, in FIG. 1, numeral 71 designates the stage for holding the photosensitive substrate 74 on the main surface thereof, and the photosensitive substrate 74 is a semiconductor wafer 72 coated with a photosensitive material layer 73 for example of a photoresist.

Next, a second embodiment of the variable optical system 30 is a Keplerian optical system, as shown in FIG. 6, comprising a first positive lens group 33 set between the first plane P1 and the second plane P2 and a second positive lens group 34 set between the first positive lens group 33 and the second plane P2.

A first example of application of the Keplerian optical system is provided with a stop 81 (diaphragm) for prevention of stray light at a position of an image PO of the pupil P of projection optical system 20. A second example of application of the Keplerian optical system has such an arrangement that an optical path splitting member 82 such as a beam splitter is set in an optical path between the first and second positive lens groups 33, 34. If the second application example is arranged with a new detector on the reflection side of the optical path splitting member 82, the alignment of wafer and the alignment of reticle can be checked independently of each other.

The exposure apparatus according to the present invention is provided with an illumination optical system for projecting the exposure light. If the apparatus is arranged in such a manner that the exposure light is projected onto the reticle in the direction perpendicular to the optical axis of the variable optical system, a dichroic mirror DM is provided between the first plane P1 and the second plane P2 in order to change an optical path of the exposure light projected from the illumination optical system through an objective lens. In particular, this dichroic mirror DM is set either between the second plane P2 and the variable optical system 30, in the optical path inside the variable optical system 30, or between the variable optical system 30 and the first plane P1.

According to the above-described structure, an image of the reticle observed from the objective lens side in the alignment optical system is a reduced image. Here, the size of the alignment optical system (a necessary optical path) is nearly proportional to the observed reticle size, and an area of the alignment optical system (a floor space necessary to construct the above alignment optical system of the optical path) is proportional to the square of the reduction ratio by the variable optical system. Therefore, the exposure apparatus has achieved a great size reduction of the alignment optical system.

The shorter optical path of the alignment optical system reduces the portion susceptible to air fluctuation, which improves the accuracy of position detection. Particularly in the case of the alignment optical system of the TTR method, because the alignment optical system is susceptible to air fluctuation due to heat of the exposure light, the detection accuracy is considerably improved.

Further, the size reduction of the alignment optical system also decreases the size of the alignment mechanism itself and enhances the stability of the exposure apparatus itself as well. Here, in the case of the alignment optical system of the TTR method, because the alignment optical system itself is located in the upper portion of the exposure apparatus, the above-described structure is effective in particular.

In the above-described structure, if the projection optical system is telecentric on the reticle side (i.e., object-side telecentric), the variable optical system is constructed of an afocal optical system. If the projection optical system is not telecentric on the reticle side (for example, if it is image-side telecentric), the variable optical system is arranged as telecentric on the alignment optical system side. This structure keeps fixed an inclination of the optical axis of a beam incident into the alignment optical system even on occasions for example of reprinting of alignment mark on the wafer or movement of the alignment optical system with a change of reticle size. Further, this structure can obviate an optical element for correction to be set in the alignment optical system, thereby simplifying the structure of the alignment optical system itself.

In the case of the different wavelength alignment (which is alignment using the alignment light of a different wavelength from that of the exposure light), it is generally necessary to take into account a distortion generated when the alignment light passes through the projection optical system. In this case, the projection optical system needs to have aberration characteristics to correct the distortion. The exposure apparatus according to the present invention, however, is so arranged that the alignment mechanism performs the alignment through the variable optical system, thereby removing influence of distortion of the projection optical system in the alignment light.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DETAILED DESCRIPTION OF THE PREFERRED EMBODIMENTS

Figure 1:
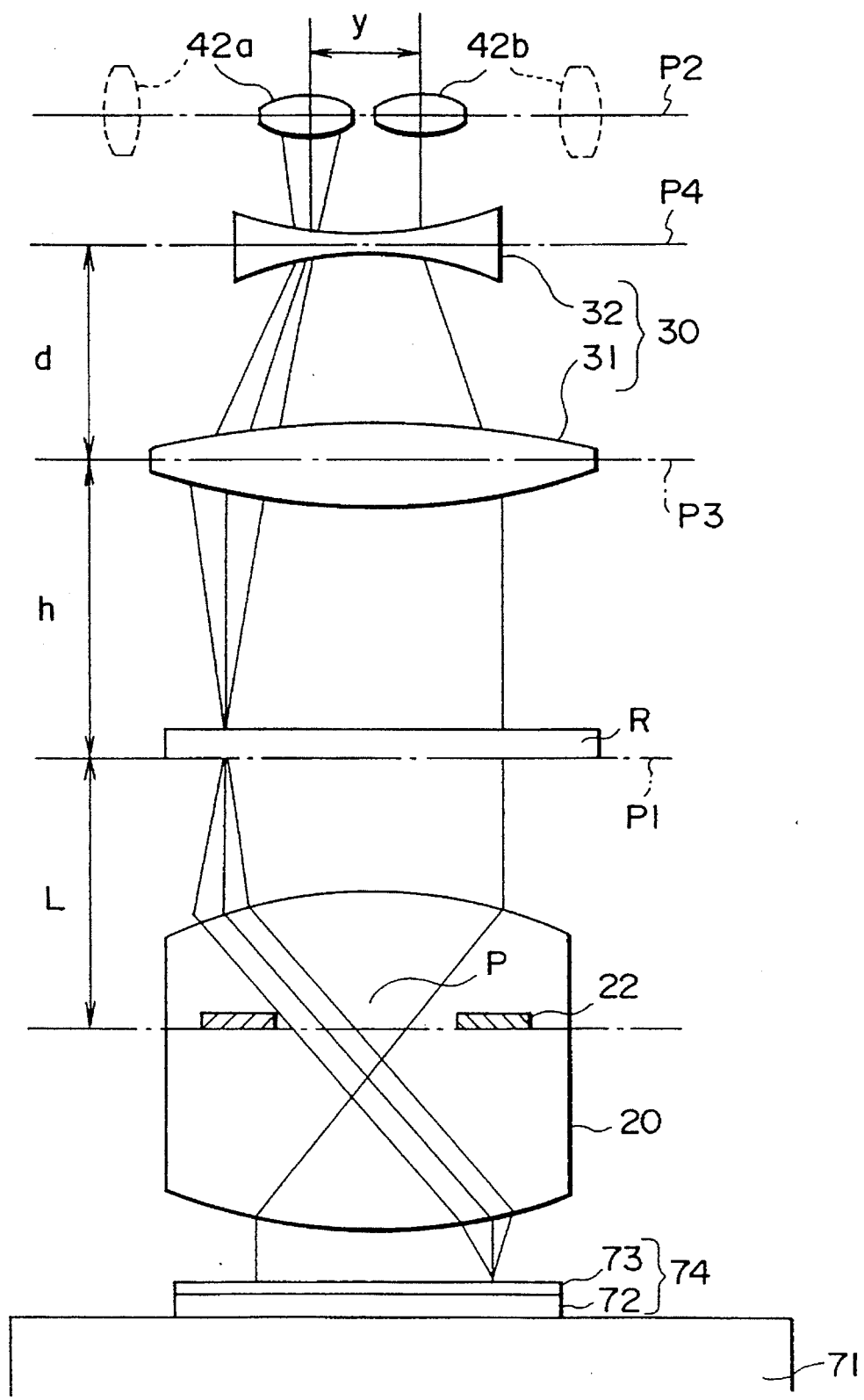
FIG. 1 is a drawing to illustrate designing conditions of a variable optical system (Galilean optical system) in the exposure apparatus according to the present invention.
Figure 2:
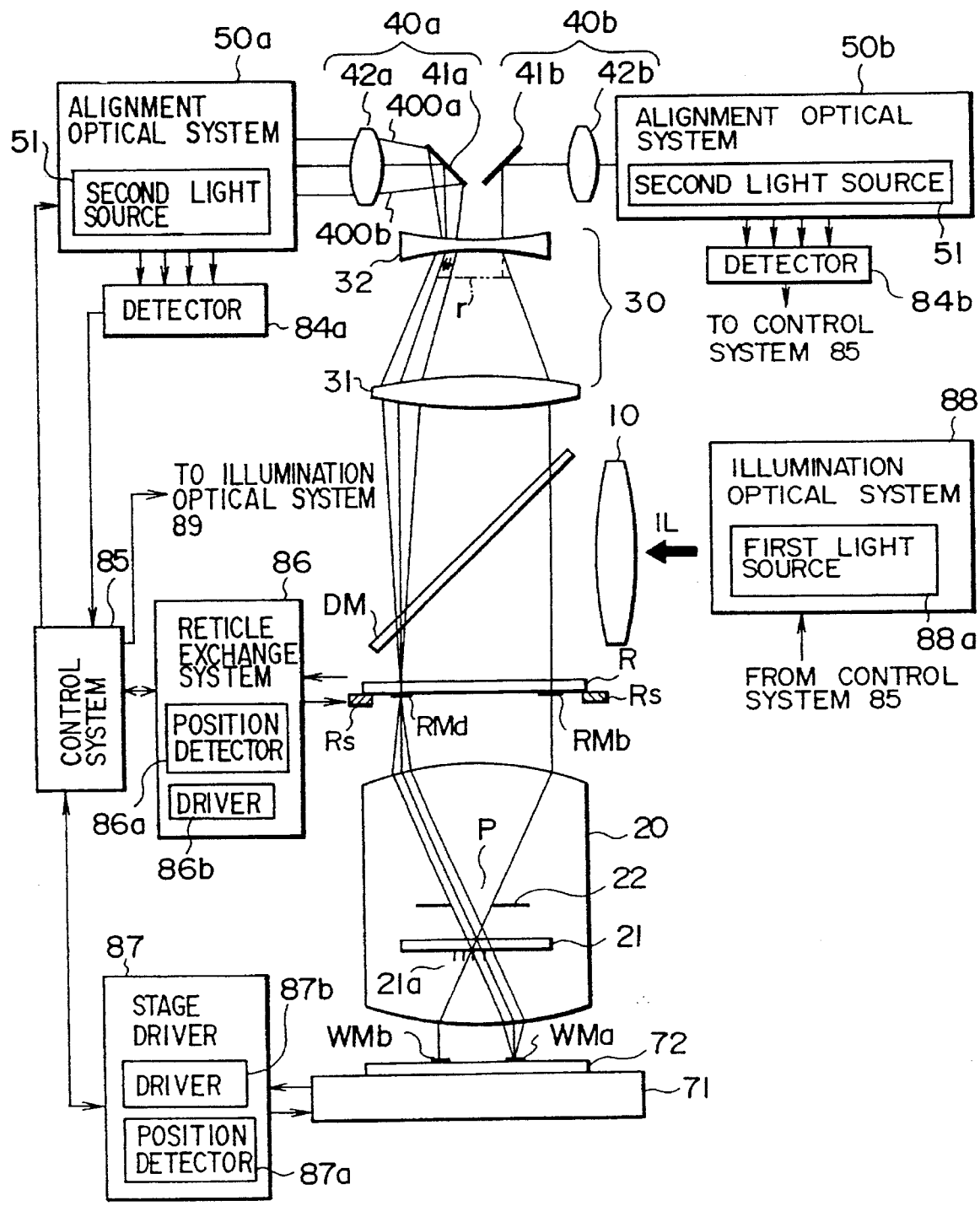
FIG. 2 is a drawing (including the first embodiment of the variable optical system) to diagrammatically show the entire structure of an embodiment of the exposure apparatus according to the present invention.

The embodiments according to the present invention will be described referring to the accompanying drawings. FIG. 2 is a schematic drawing to show an example where an alignment mechanism according to the present invention is applied to a projection exposure apparatus.

In FIG. 2, an illumination optical system 88 has a first light source 88a for supplying exposure light IL, for example such as the excimer laser light (249 nm: KrF, 193 nm: ArF), the g-line (436 nm), the i-line (365 nm), etc. This exposure light IL is guided through a condenser lens 10 and via a dichroic mirror DM to uniformly illuminate a reticle R on which a predetermined circuit pattern is formed. An image (pattern image) of the thus illuminated reticle R is guided through a projection optical system 20 having a predetermined reduction ratio (for example a ratio of 5:1) to form a reduced image of reticle R. A wafer 72 coated with a photosensitive agent 73 such as a photoresist is set at the position where the image of reticle R is formed. This photosensitive substrate 74 is mounted on a wafer stage 71 arranged as two-dimensionally movable.

The related art to the illumination optical system 88 in the exposure apparatus is described for example in U.S. Pat. 4,851,978, U.S. Pat. No. 4,939,630, U.S. Pat. No. 5,237,367, and U.S. Pat. No. 5,245,384.

Figure 3:
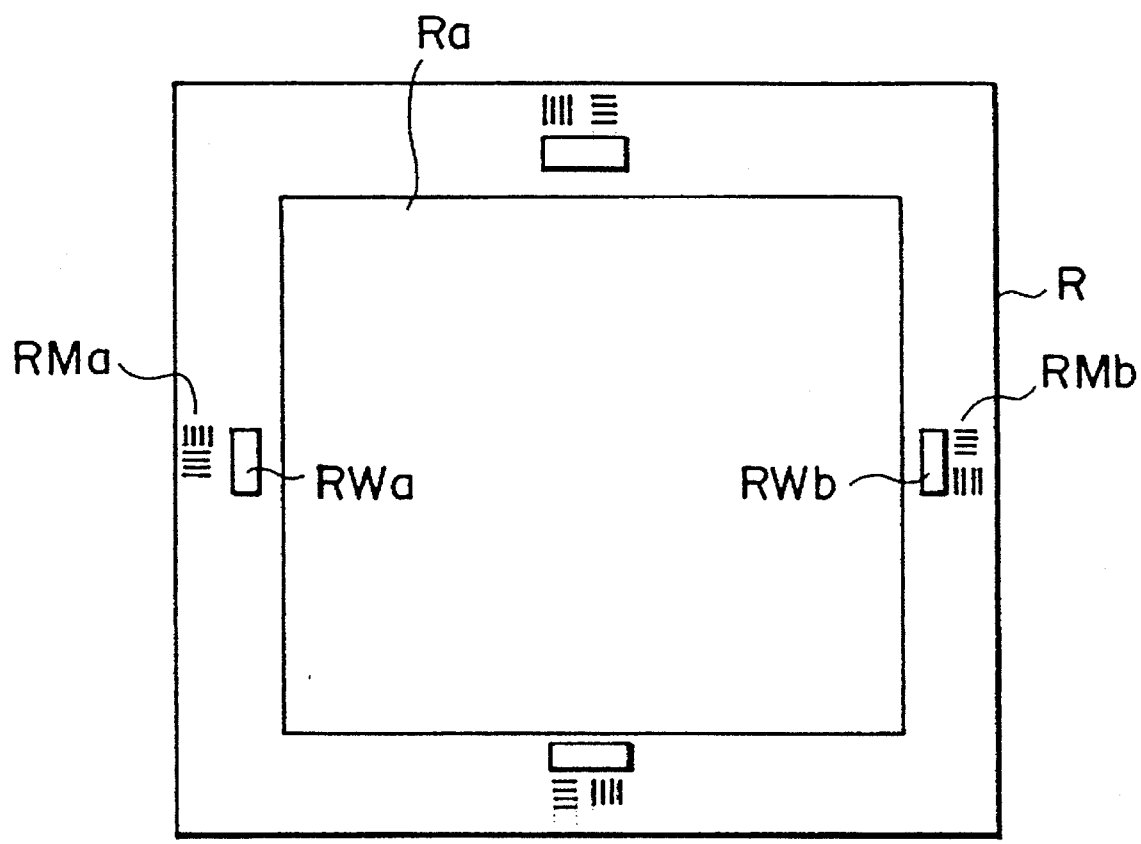
FIG. 3 is a drawing to show an example of construction of a reticle.

Here, as shown in FIG. 3, reticle marks RMa, RMb each being a diffraction grating of a predetermined pitch are provided on the reticle R. Also, wafer marks WMa, WMb each being a diffraction grating of a predetermined pitch are formed by first exposure on the wafer 72.

For successive exposures after the first exposure on the wafer 72, a relative positional deviation is detected between the wafer marks WMa, WMb formed by the first exposure and the reticle marks RMa, RMb and then each exposure is done under conditions without a positional deviation.

In FIG. 3, RWa, RWb each designate a window for letting the alignment light supplied from each alignment optical system 50a, 50b pass. Also, a pattern such as circuits to be transferred onto the wafer 72 is preliminarily formed in a region Ra on the reticle R.

Next described is the structure of the exposure apparatus according to the present invention.

The exposure apparatus has a stage 71 for holding the wafer 72 coated with a photosensitive material 73 such as a photoresist (i.e., the photosensitive substrate 74) on a main surface thereof, the illumination optical system 88 having the first light source 88a for emitting the exposure light of the predetermined wavelength, for transferring the pattern of circuits etc. on the reticle R onto the wafer 72, a projection optical system 20 for forming a pattern image of reticle R on the surface of the wafer 72, alignment optical system 50a(50b) each having a second light source 51 for emitting the alignment light of the predetermined wavelength, for optically detecting positions of the reticle mark RMa (RMb) and the wafer mark WMa (WMb) through an associated optical system 40a (40b), utilizing the alignment light, and a variable optical system 30 for obtaining a reduced image of reticle R, provided between the first plane on which the reticle R is to be located and the second plane which is parallel to the first plane and on which the objective lens 42a (42b) are to be located.

In the exposure apparatus in this embodiment, a plurality of alignment marks are provided on each of the reticle R and the wafer 72 in order to detect a relative positional deviation between the reticle R and the substrate 74 (including the wafer 72) (FIGS. 2 and 3). Thus, at least one pair of the optical system 40a, 40b and the alignment optical system 50a, 50b are prepared for each alignment mark.

This exposure apparatus further comprises a detector 84a (84b) for obtaining from the alignment optical system 50a (50b) reference information related to the alignment light emitted from the second light source 51 and measurement information related to the reflected light of the alignment light emitted toward the reticle mark RMa (RMb) and the wafer mark WMa (WMb) through the objective lens 42a (42b) and detecting a positional deviation between the reticle mark RMa (RMb) and the wafer mark WMa (WMb), based on the reference information and measurement information, a stage driver 87 for driving the stage 71 so as to move the wafer 72 in parallel with the reticle R, and a reticle exchange system 86 (mask exchange system) for exchanging the reticle R for another and finely moving the reticle.

The each detector 84a, 84b is prepared for each alignment optical system 50a, 50b. The reticle exchange system 86 has at least a position detector 86a for always monitoring a position of the reticle R, and a driver 84b for directly moving the reticle R. Further, the stage driver 87 has a position detector 87a for always monitoring a position of the stage 71 in order to indirectly check the position of the wafer 72, and a driver 87b for directly moving the stage 71.

Further, the exposure apparatus has a control system 85 for controlling at least the illumination optical system 88, reticle exchange system 86, and stage driver 87. Adjusting the relative position to the wafer 71 based on the information on positional deviation obtained from the detectors 84a, 84b, the control system controls operation of the reticle exchange system 86 and/or stage driver 87.

Accordingly, the alignment mechanism in the exposure apparatus is provided at least with the variable optical system 30, optical systems 40a, 40b (including the objective lenses 42a, 42b, respectively), alignment optical systems 50a, 50b, and detectors 84a, 84b, as located in the upper portion of the exposure apparatus.

The related art to the structure including the alignment optical systems 50a, 50b to the stage driver 87 in the exposure apparatus is described for example in U.S. Pat. No. 4,962,318, U.S. Pat. No. 5,118,953, and U.S. Pat. No. 5,138,176.

The structure of detectors 84a, 84b and control system 85 may be one realized by a single computer or one realized by separate processors which can be operated independently of each other.

In the alignment mechanism according to the present invention, the alignment optical system 50a (50b) observes the wafer mark WMa (WMb) and the reticle mark RMa (RMb) through the objective lens 42a (42b), whereby a relative positional deviation is detected between the wafer mark WMa (WMb) and the reticle mark RMa (RMb). The related art to the structure of the alignment optical systems 50a, 50b is described for example in Japanese Laid-open Patent Application No. 5-160001, U.S. Pat. No. 5,214,489 and U.S. Pat. No. 5,118,953.

Figure 4:
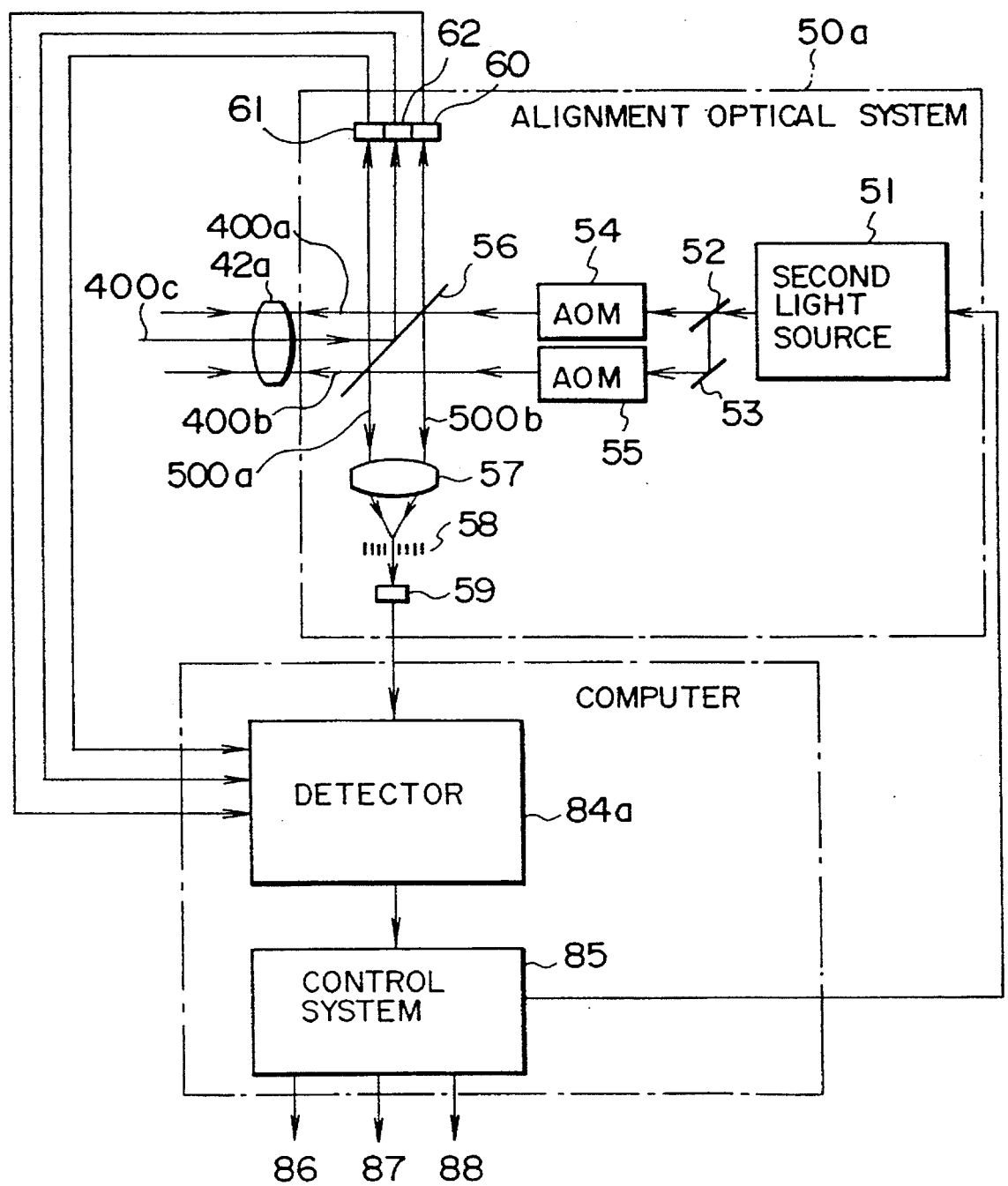
FIG. 4 is a drawing to schematically show main part of an alignment mechanism in the exposure apparatus according to the present invention.

Now, the alignment optical system 50a is described referring to FIG. 4. It is noted that the alignment optical system 50b also has the same structure.

In FIG. 4, the light source 51 (second light source) supplies the alignment light of the wavelength different from that of exposure light IL. The alignment light is guided by a beam splitter 52 and a mirror 53 to enter two acousto-optic devices (AOM) 54, 55 driven with a predetermined frequency difference. The alignment light through these acousto-optic devices 54, 55 is let to pass a half mirror 56 in the form of two supply beams having the predetermined frequency difference to enter the objective lens 42a.

Returning to FIG. 2, the description is continued. The two supply beams 400a, 400b from the objective lens 42a pass through the dichromic mirror DM, which reflects the exposure light IL and transmits the alignment light, to reach the reticle mark RMa. Here, because the window RWa is provided near the reticle mark RMa, the two supply beams 400a, 400b simultaneously illuminate the reticle mark RMa and window RWa.

The two supply beams 400a, 400b having passed through the window RWa near the reticle mark RMa enter the projection optical system 20. Further, the supply beams 400a, 400b are let to pass through a diffraction grating plate 21 having a diffraction grating 21a and placed near the pupil P (pupil plate 22) of the projection optical system 20 to be deflected by a predetermined angle and thereafter to illuminate the wafer mark WMa with a predetermined angle of divergence. On this occasion, beat light appears on the wafer mark WMa as changing the light intensity at a predetermined frequency. This beat light travels perpendicular to the main surface of wafer 72 and again enters the projection optical system 20. The beat light having entered the projection optical system 20 is deflected by a predetermined angle by the diffraction grating plate 21 and thereafter is emitted from the projection optical system 20 so as to pass through the window RWa on the reticle R. This beat light travels through the dichromic mirror DM and the objective lens 42a again to enter the alignment optical system 50a.

The related art to the diffraction grating plate 21 in the projection optical system 20 is described for example in U.S. Pat. No. 5,272,501.

In FIG. 4, the beat light 400c generated on the wafer mark WMa passes near the optical axis of objective lens 42a and thereafter is reflected by the half mirror 56 to reach a photoelectric conversion device 62 for example constituted of a photomultiplier tube, where the beat light 400c is converted into a sinusoidal ac signal (first measurement information) according to the period of the beat light 400c.

Again returning to FIG. 2, the description is continued. A +first order diffracted light component of one supply beam (say the beam 400a) out of the two supply beams 400a, 400b projected to the reticle mark RMa is diffracted so as to travel backward in the optical path of the other supply beam (say the beam 400b). Similarly, a −first order diffracted light component of the other supply beam (the beam 400b) is diffracted so as to travel backward in the optical path of the one supply beam (the beam 400a). Here, these ±first order diffracted light components and normal reflected light component (zeroth order light component) are again guided through the dichromic mirror DM and the objective lens 42a to enter the alignment optical system 50a.

In FIG. 4, these zeroth order and ±first order light components are reflected by the half mirror 56 to enter photoelectric conversion devices 60, 61. Here, the photoelectric conversion devices 60, 61 photoelectrically convert the zeroth order and ±first order light components from the reticle mark RMa to generate sinusoidal ac signals (second measurement information).

Among the supply beams from the two acousto-optic devices 54, 55, light 500a, 500b reflected by the half mirror 56 is guided by a lens 57 to cross each other on a diffraction grating 58 of a predetermined pitch so as to generate light beat according to the frequency difference between the supply beams. This light beat is photoelectrically converted by a photoelectric conversion device 59 to produce an ac signal (reference information) to be the reference.

A detector 84a detects a phase difference between the ac signal (reference information) produced by the photoelectric conversion device 59 and the ac signal (first measurement information) produced by the photoelectric conversion device 62, thereby detecting the position of wafer mark WMa. Also, the detector 84a detects a phase difference between the reference information and the ac signals (second measurement information) produced by the photoelectric conversion devices 60, 61, thereby detecting the position of reticle mark RMa Based on the positional deviation information of the detector 84a and positional deviation information of the other detector 84b, the control system 85 performs a control to drive the wafer stage 71 or reticle stage RS.

Although only the alignment system 50a was described above, the alignment optical system 50b has the same function.

Next, the exposure apparatus includes the variable optical system 30 in the optical path between the reticle R and the pair of objective lenses 42a, 42b. This variable optical system 30 is composed of a positive lens group 31 and a negative lens group 32 in order from the reticle R side. In this arrangement, a reduced virtual image r of reticle R is formed in the optical path between the positive lens group 31 and the negative lens group 32.

A Galilean optical system is employed as a first embodiment in order to make the entire length of the variable optical system 30 shorter.

Here, an image of reticle R observed from the side of alignment optical systems 50a, 50b is a reduced image r. The size (optical path) of each alignment optical system 50a, 50b is proportional to the observed size of the reduced image r, and an area occupied by each alignment optical system 50a, 50b (floor space necessary to construct the alignment optical system) is proportional to the square of the reduction ratio by the variable optical system 30. Accordingly, a considerable size reduction of the alignment optical systems 50a, 50b can be achieved. For example, when the reduction ratio of the projection optical system 20 is 5:1 and the shot area (exposure area) on the wafer 72 is sized in 20 mm×20 mm (20 mm square), the circuit pattern (region Ra) of reticle R becomes 100 mm ×100 mm (100 mm square). Here, when the reduction ratio of the variable optical system 30 is 2:1, the size of the alignment optical systems 50a, 50b becomes about a half and a necessary floor space is about a quarter. This permits the weight of the alignment optical systems 50a, 50b to be reduced to a fraction of the original weight, thus enhancing the stability of the entire exposure apparatus.

In the case of the alignment mechanism of the so-called TTR method to perform alignment through the dichromic mirror DM as in the present embodiment, air fluctuation is apt to be caused by heat radiation of the exposure light IL. In the exposure apparatus according to the present invention, however, the optical path of the portion susceptible to the air fluctuation can be shortened by reducing the size of the alignment optical systems 50a, 50b, thereby greatly lowering the deterioration of accuracy of position detection due to the air fluctuation.

Figure 5:
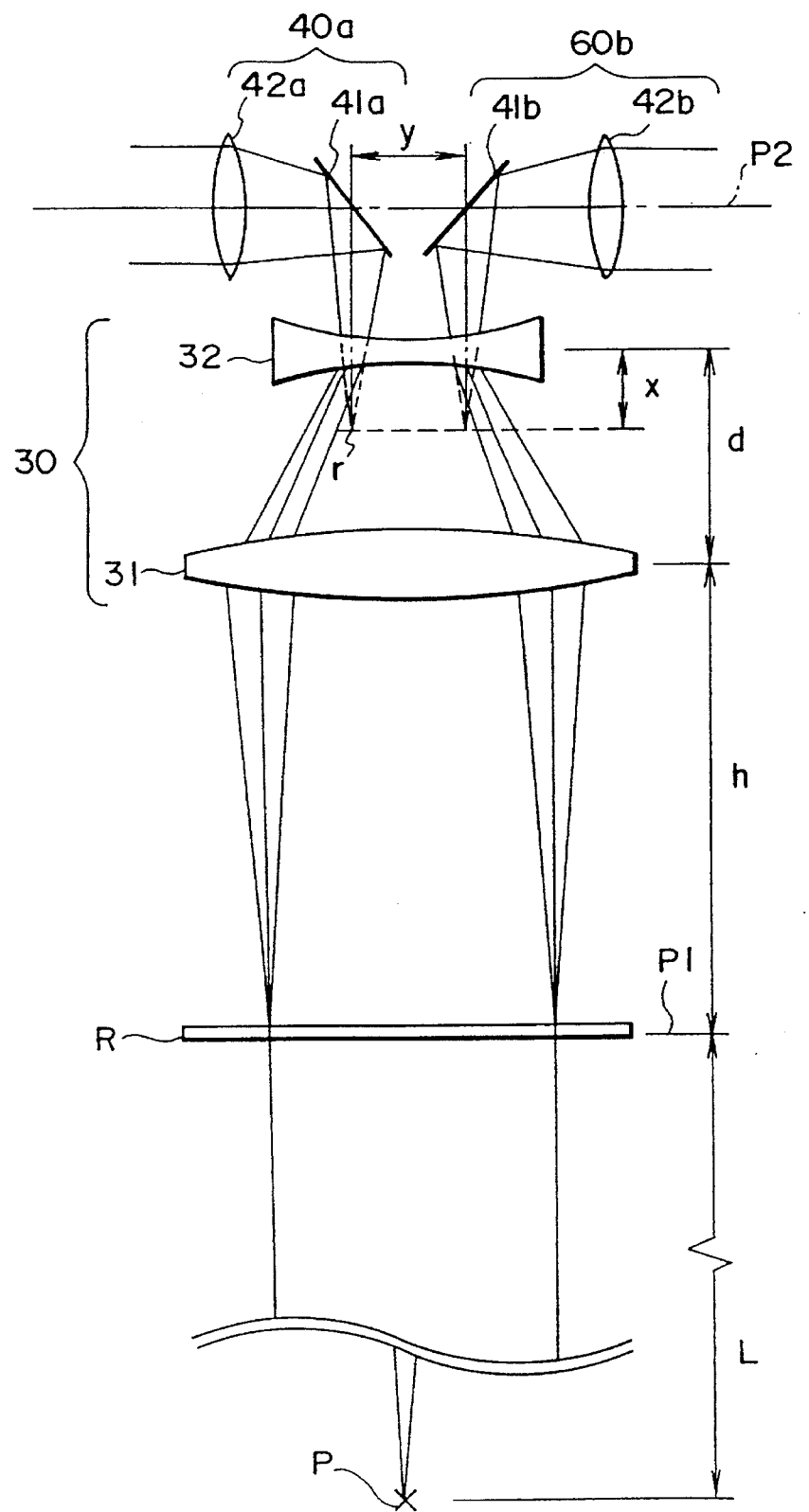
FIG. 5 is a drawing (including a mirror for changing an optical path) to illustrate designing conditions of a variable optical system (Galilean optical system) in the exposure apparatus according to the present invention.

The structure of the variable optical system 30 is next described referring to FIG. 5. In FIG. 5, the dichromic mirror DM and the projection optical system 20 are omitted for brevity of description.

In FIG. 5, where a separation between a pair of path bending mirrors 41a, 41b is y (in the case of the optical path being not bent, a separation between the pair of objective lenses 42a, 42b), the numerical aperture on the reticle R, of each alignment light is NA, and the reduction ratio of the variable optical system 30 is β (0<β<1), the separation y needs to satisfy the following formula (1).

$$y > 2 \cdot x \cdot NA/\beta \tag{1}$$

Here, x (x>0) is a distance between the negative lens group 32 (the principal plane P4) and the virtual image r, which is expressed by the following formula (2).

$$x = (\beta/(1+(h-f_1)/L)) \cdot (f_1 + \beta h - f_1 \beta) \tag{2}$$

In the above formula, h: a distance between the variable optical system 30 (the principal plane P3 of the positive lens group 31) and the reticle R (the plane P1);

$f_1$: a focal length of the positive lens group 31;

L: a distance between the reticle R and the entrance pupil P (pupil plane 22) of the projection optical system 20.

Substituting the above formula (2) into formula (1), the following formula (3) is obtained.

$$h < (1-K)^{-1}[(y/(2\beta \cdot NA)) \cdot (1-f_1/L) - (\beta^{-1}-1) \cdot f_1] \tag{3}$$

Here, K=y/(2βL·NA).

The above formulas (1) to (3) are satisfied in a state where the variable optical system 30 is telecentric on the alignment optical system side.

If either these formula (1) and formula (2) or the formula (3) is not satisfied, the position of the virtual image r formed by the variable optical system 30 becomes closer to the reticle R. In this state, where beams having some N.A. enter the paired objective lenses 42a, 42b, the beams overlap with each other. In other words, unless the distance h between the variable optical system 30 and the reticle R is rather short, the position of the virtual image r approaches the reticle R so as to make the beams overlap with each other. In this case, the size of the pair of objective lenses 42a, 42b (or the path bending mirrors 41a, 41b) becomes larger, which causes a restriction on movement of observation position of the alignment optical systems 50a, 50b.

From the condition that the variable optical system 30 is telecentric on the alignment system side, the focal length $f_2$ of the negative lens group 32 and the principal plane separation d between the positive lens group 31 and the negative lens group 32 satisfy the following relations of formula (4) and formula (5).

$$f_2 = -\beta f_1/(1+((h-f_1)/L)) \tag{4}$$

$$d = f_1(1-\beta + h/L)/(1+((h-f_1)/L)) \tag{5}$$

If the projection optical system 20 is a both-side telecentric optical system (if it is telecentric on the wafer 72 side and on the reticle R side), the distance L between the reticle R and the entrance pupil P of projection optical system 20 is set to the infinity. By this setting, the variable optical system 30 satisfies the following formulas (6) to (8).

$$h < (y/(2\beta \cdot NA)) - ((\beta^{-1}-1) \cdot f_1) \tag{6}$$

$$f_2 = -\beta \cdot f_1 \tag{7}$$

$$d = f_1(1-\beta) \tag{8}$$

when the above formulas (1) to (8) are satisfied, no beams overlap in the objective lenses 42a, 42b each arranged for each alignment optical system 50a, 50b, whereby the plurality of alignment marks on the reticle R or wafer 72 can be observed. Here, the size of the objective lenses 42a, 42b (or the mirrors 41a, 41b) can be decreased by setting the position of the virtual image r of reticle R closer to the negative lens group 32.

Although the above description of formulas (1) to (8) concerned a pair of objective lenses 42a, 42b, the above formulas (1) to (8) cannot be applied only to cases with a pair of objective lenses, but also to cases with two or more sets of objective lenses. Further, the above formulas (1) to (8) are also satisfied where the path bending mirrors 41a, 41b are not set between the variable optical system 30 and the objective lenses 42a, 42b.

Figure 6:
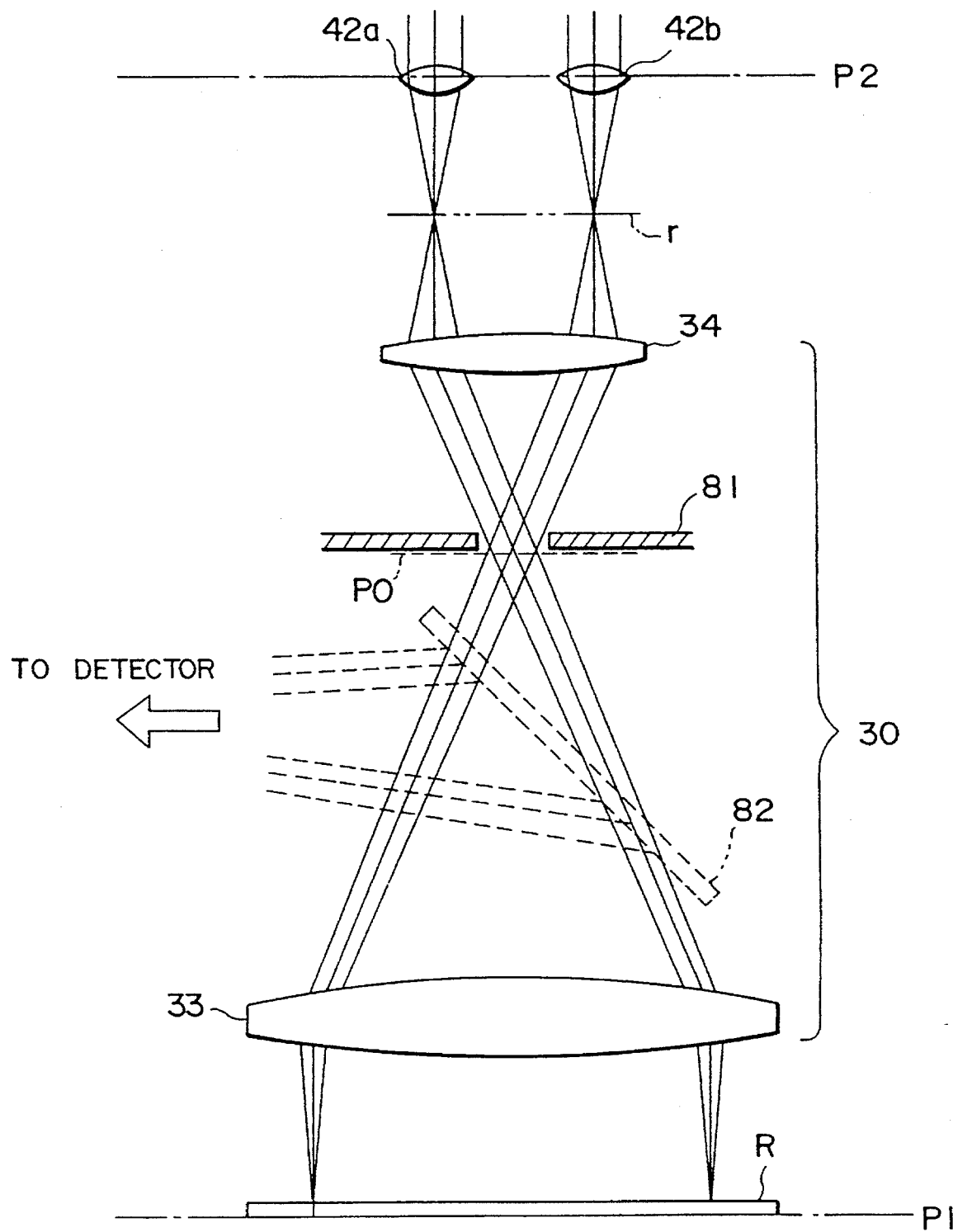
FIG. 6 is a drawing to show a second embodiment (Keplerian optical system) of the variable optical system in the exposure apparatus according to the present invention.

The above first embodiment employed the variable optical system 30 being a Galilean optical system, but a second embodiment of the variable optical system 30 is composed of a Keplerian optical system. Next described referring to FIG. 6 is an example in which the variable optical system 30 is a Keplerian optical system. In FIG. 6, members having the same functions as those in the embodiment shown in FIG. 2 are denoted by the same reference numerals for simplicity of illustration.

In FIG. 6, the variable optical system 30 has a first positive lens group 33 and a second positive lens group 34 in order from the reticle R side. Here, the first positive lens group 33 forms an image PO of the pupil of projection optical system 20 in an optical path between the first positive lens group 33 and the second positive lens group 34. Light from this image PO of the pupil is guided through the second positive lens group 34 to form a reduced real image r of reticle R between the variable optical system 30 and the objective lenses 42a, 42b. With this structure, the alignment optical systems 50a, 50b (not shown) also observe the reduced image r of reticle R. Thus, the size of the alignment optical systems 50a, 50b will be naturally decreased. In the second embodiment shown in FIG. 6, the entire length of the variable optical system 30 becomes longer than that in the first embodiment (Galilean optical system). On the other hand, because the image PO of the pupil of the projection optical system 20 is formed, it is effective to employ such an arrangement that a stop 81 for preventing stray light is set at the position of the image PO of the pupil (an application example). If a path splitting member 82 such as a beam splitter is provided in the optical path between the pair of positive lens groups 33, 34, a detection system for checking for example alignment of reticle can be set on the reflection side of the path splitting member 82 (another application example). With the second embodiment of FIG. 6, no beams entering the pair of objective lenses 42a, 42b overlap with each other even if the separation is short between the image r of reticle R and the objective lenses 42a, 42b.

Incidentally, the alignment optical systems 50a, 50b and the objective lenses thereof 42a, 42b are often arranged as movable in a plane the normal line of which is the optical axis of the projection optical system 20, upon re-printing of wafer marks WMa, WMb on the wafer 72 or upon a size change of reticle R. In this case, the variable optical system 30 is arranged as telecentric on the side of the alignment optical systems 50a, 50b (or on the side of objective lenses 42a, 42b).

Here, if the variable optical system 30 is not telecentric on the alignment optical system side, an angle of the beams entering the objective lenses 42a, 42b changes with movement of the alignment optical systems 50a, 50b. With the angular change of beams, it becomes necessary to increase the effective diameter of the objective lenses 42a, 42b in order to receive the beams. In addition, a correction optical element (for example a rockable plane-parallel plate) needs to be provided for correcting the angular change of the beams in the alignment optical systems 50a, 50b.

If the variable optical system 30 is telecentric on the alignment optical system side, the objective lenses 42a, 42b having a small aperture can fully function, thus also simplifying the structure of the alignment optical systems 50a, 50b. If the projection optical system 20 is a both-side telecentric optical system, the variable optical system 30 is constructed of an afocal system.

If the wavelength of the alignment light is different from that of the exposure light IL as in the exposure apparatus shown in FIG. 2, the projection optical system 20 could produce a distortion in the image of reticle R formed on the wafer 72. Even in that case, a reticle image without distortion can be observed in the alignment optical systems 50a, 50b by designing the variable optical system 30 so as to cancel the distortion.

Figure 7:
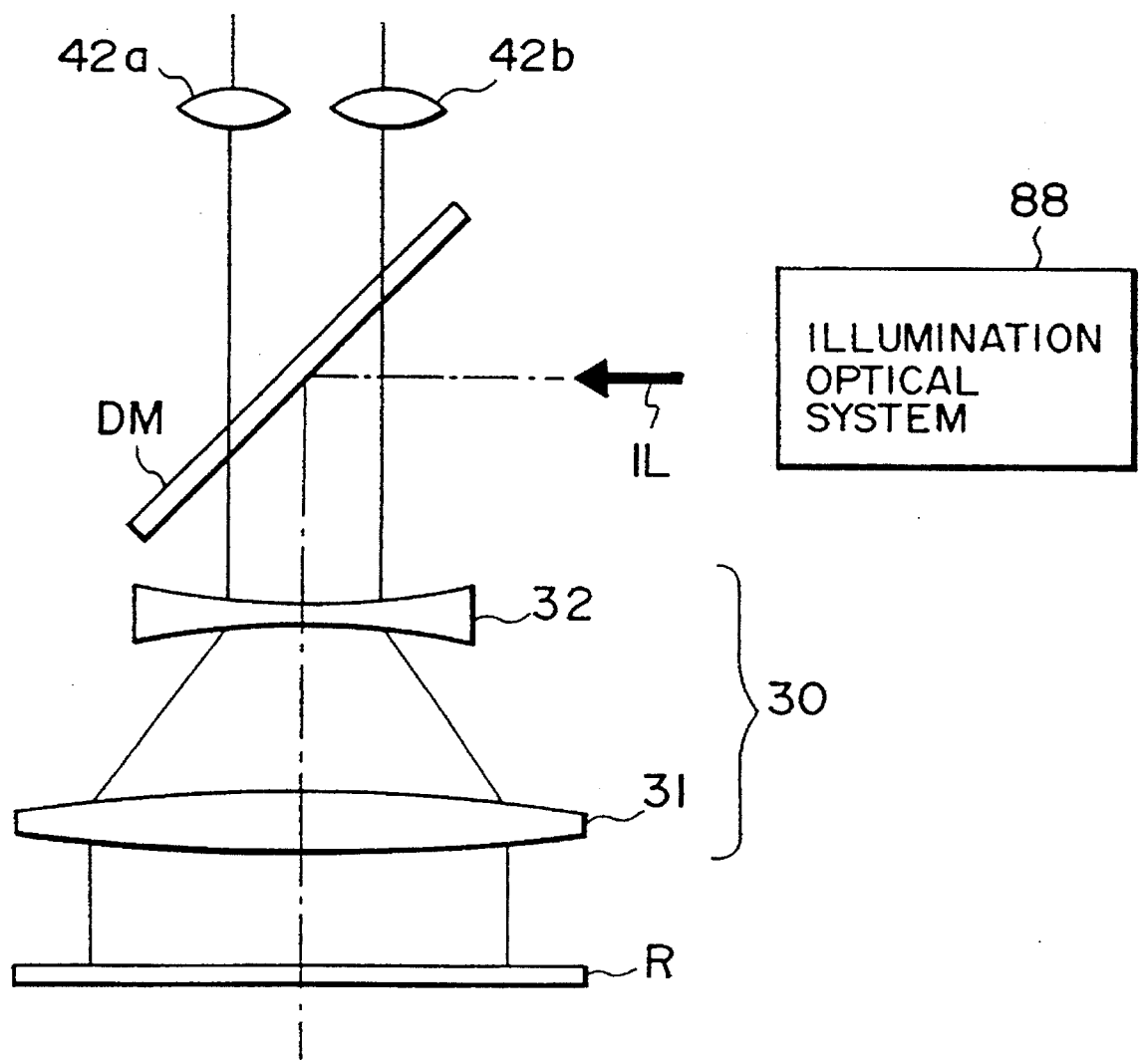
FIG. 7 is a drawing to show an application example of the exposure apparatus according to the present invention, particularly the structure between objective lenses and a reticle.

Although the above-described variable optical system 30 is placed in the optical path between the dichromic mirror DM and the objective lenses 42a, 42b, the location of the variable optical system 30 is not limited to it. For example, as shown in FIG. 7, the variable optical system 30 may be placed in the optical path between the dichroic mirror DM and the reticle R. In this application example, the exposure light IL emitted from the illumination optical system 88 is reflected by the dichroic mirror DM and then passes through the variable optical system 30 to reach the reticle R. Accordingly, there may be cases where the illumination optical system 88 is optically designed including the variable optical system 30. Also, this arrangement cannot decrease only the size of the alignment optical systems 50a, 50b but also the size of the illumination optical system 88.

Figure 8:
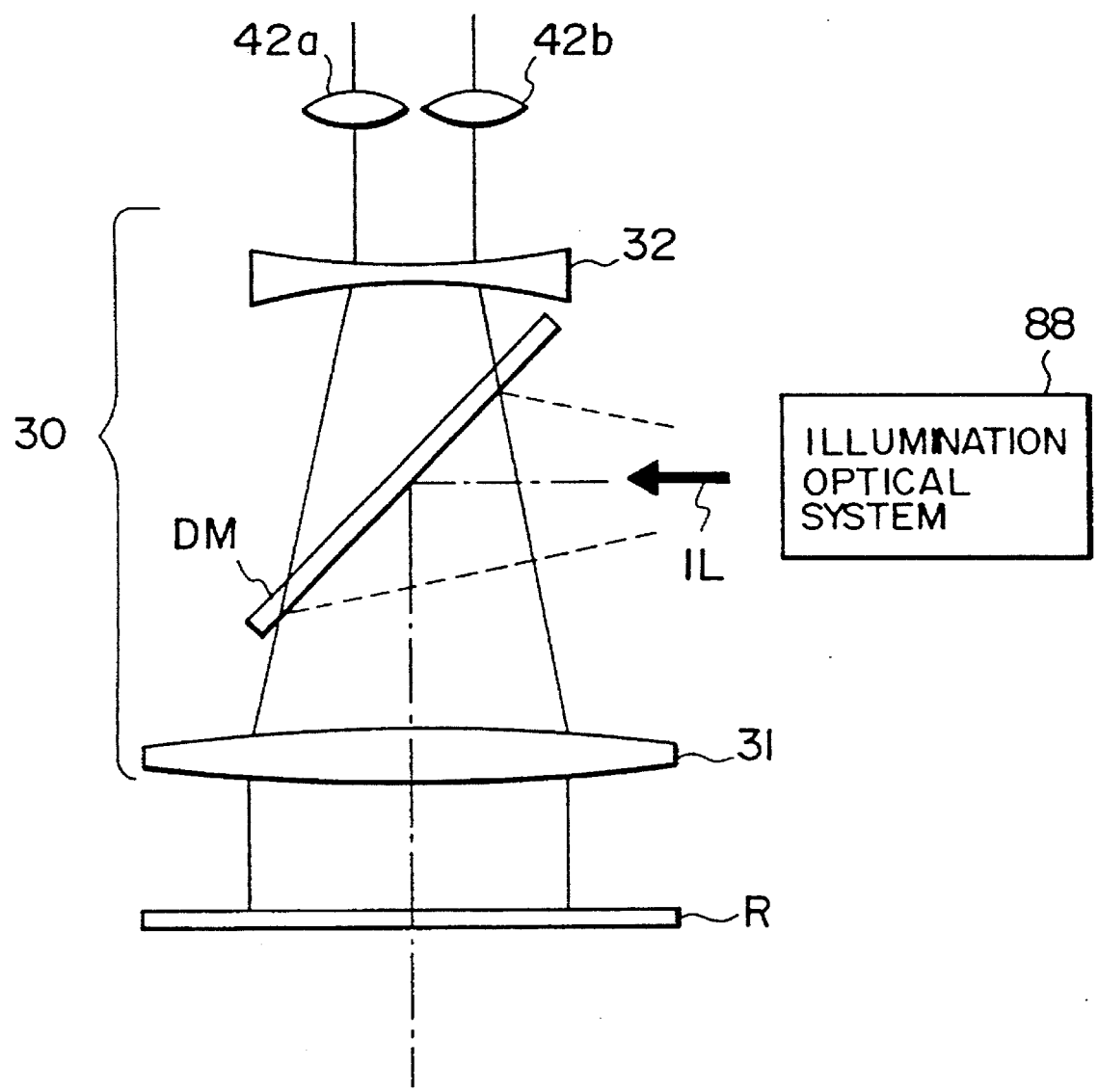
FIG. 8 is a drawing to show an application example of the exposure apparatus according to the present invention, particularly the structure between an objective lenses and a reticle.

As a further application example of the exposure apparatus, as shown in FIG. 8, there is an arrangement in which a part of the variable optical system 30 and a part of the illumination optical system 88 are shared. In FIG. 8, the alignment mechanism utilizes the alignment light passing through the positive lens group 31, dichromic mirror DM, and negative lens group 32 in order to detect the reticle mark or wafer mark. The illumination optical system 88 illuminates the reticle R with the exposure light guided via the dichromic mirror DM and the positive lens group 31. This arrangement can simplify the exposure apparatus.

The above exposure apparatus were described as to the so-called LIA (Laser Interferometric Alignment) for performing alignment with beams having a predetermined frequency difference. The exposure apparatus can employ other alignment methods, for example the so-called LSA (Laser Step Alignment) for scanning for example a laser beam and a mark (reticle mark or wafer mark) and receiving diffracted light appearing at the mark, or alignment of image detection of mark.

Although each lens group 31 to 34 constituting the variable optical system 30 as described above is shown by a single lens, the same effect will be achieved by arrangements in which the each lens group is composed of two or more lenses.

As described above, the present invention enables considerable size reduction and weight reduction of the alignment mechanism (particularly, of the alignment optical system). Also, this invention realizes enhancement of the stability of apparatus, and cost reduction. The size reduction of the apparatus itself realizes a decrease of the path length of the alignment optical system and makes the alignment optical system immune to the influence of air fluctuation, thereby achieving an improvement of accuracy of position detection.

From the invention thus described, it will be obvious that the invention may be varied in many ways. Such variations are not to be regarded as a departure from the spirit and scope of the invention and all such modifications as would be obvious to one skilled in the art are intended to be included within the scope of the following claims.

The basic Japanese Application Nos.317031/1993 filed on Dec. 16, 1993 and 334499/1993 filed on Dec. 28, 1993 are hereby incorporated by reference.

What is claimed is:

1. A variable optical system used in an exposure apparatus having a projection optical system for transferring an image of a pattern on a mask onto a photosensitive substrate, and a plurality of alignment optical systems for independently detecting a plurality of alignment marks provided at least on the mask and detecting associated alignment marks corresponding thereto through respective objective lenses, said variable optical system being for obtaining a reduced image of said mask, said variable optical system being a Galilean optical system comprising:

a positive lens group set between a first plane on which said mask is to be located and a second plane which is parallel to said first plane and on which at least a pair of said objective lenses are to be located; and a negative lens group set between said positive lens group and said second plane;

said Galilean optical system being defined as follows:

$$h < (1-K)^{-1} \{ (y/(2\beta \cdot NA)) \cdot (1-f_1/L) - (\beta^{-1} - 1) \cdot f_1 \}$$

$$K = y/(2\beta L \cdot NA)$$

$$f_2 = -\beta f_1/(1+((h-f_1)/L))$$

$$d = f_1(1-\beta+h/L)/(1+((h-f_1)/L))$$

where
- h: a distance between said mask and the principal plane of said positive lens group;
- y: a distance between said objective lenses;
- NA: a numerical aperture of said objective lenses;
- β: a reduction ratio (0<β<1) of said Galilean optical system;
- $f_1$: a focal length of said positive lens group;
- $f_2$: a focal length of said negative lens group;
- L: a distance between said mask and a pupil of said projection optical system;
- d: a principal plane separation between said positive lens group and said negative lens group.

2. A variable optical system used in an exposure apparatus having a projection optical system for projecting an image of a pattern on a mask onto a photosensitive substrate, and an alignment optical system for detecting an alignment mark provided at least on said mask through an objective lens, said variable optical system being for obtaining a reduced image of said mask, said variable optical system being a Keplerian optical system comprising:
- a first positive lens group set between a first plane on which said mask is to be located and a second plane which is parallel to said first plane and on which said objective lens is to be located; and
- a second positive lens group set between said first positive lens group and said second plane.

3. A variable optical system according to claim 2, further comprising a stop set between said first positive lens group and second positive lens group.

4. An alignment mechanism used in an exposure apparatus arranged to project exposure light onto a mask and to transfer a pattern on said mask onto a photosensitive substrate through a projection optical system, for detecting an alignment mark provided at least on said mask, said alignment mechanism comprising:
- an objective lens arranged opposite to said projection optical system with respect to a first plane on which said mask is to be located;
- an alignment optical system having a light source for emitting alignment light of a predetermined wavelength, for obtaining reference information related to said alignment light emitted from said light source and measurement information related to reflected light of said alignment light emitted toward the alignment mark provided on said mask through said objective lens;
- a detector for detecting a position of said alignment mark, based on the reference information and measurement information obtained from said alignment optical system; and
- a variable optical system set between said first plane and a second plane which is parallel to said first plane and on which said objective lens is to be located, for obtaining a reduced image of said mask.

5. An alignment mechanism according to claim 4, wherein said variable optical system is a Galilean optical system comprising a positive lens group set between said first and second planes and a negative lens group set between said positive lens group and second plane.

6. An alignment mechanism according to claim 5, wherein at least a pair of objective lenses are provided on said second plane and said alignment mechanism comprises at least one pair of alignment optical systems corresponding to said objective lenses; and
- wherein said Galilean optical system is defined as follows:

$$h < (1-K)^{-1}\{(y/(2\beta \cdot NA)) \cdot (1-f_1/L) - (\beta^{-1}-1)f_1\}$$

$$K = y/(2\beta L \cdot NA)$$

$$f_2 = -\beta f_1/(1+((h-f_1)/L))$$

$$d = f_1(1-\beta+h/L)/(1+((h-f_1)/L))$$

where
- h: a distance between said mask and the principal plane of said positive lens group;
- y: a distance between said objective lenses;
- NA: a numerical aperture of said objective lenses;
- β: a reduction ratio (0<β<1) of said Galilean optical system;
- $f_1$: a focal length of said positive lens group;
- $f_2$: a focal length of said negative lens group;
- L: a distance between said mask and a pupil of said projection optical system;
- d: a principal plane separation between said positive lens group and said negative lens group.

7. An alignment mechanism according to claim 4, wherein said variable optical system is a Keplerian optical system comprising a first positive lens group set between said first and second planes and a second positive group set between said first positive lens group and said second plane.

8. An alignment mechanism according to claim 7, wherein said variable optical system further comprises a stop provided between said first and second positive lens groups.

9. An alignment mechanism according to claim 7, wherein said variable optical system further comprises an optical path splitting member provided in an optical path between said first and second positive lens groups.

10. An exposure apparatus comprising:
- a stage for holding a photosensitive substrate on a main surface thereof;
- an illumination optical system having a first light source for emitting exposure light of a predetermined wavelength, for transferring a predetermined pattern on a mask onto said substrate;
- a projection optical system for forming an image of the pattern on said mask, on said substrate surface;
- an alignment optical system having a second light source for emitting alignment light of a predetermined wavelength, for optically detecting a position of an alignment mark provided on said mask and a position of an alignment mark provided on said substrate through an objective lens, utilizing said alignment light; and
- a variable optical system set between a first plane on which said mask is to be located and a second plane which is parallel to said first plane and on which said objective lens is to be located, for obtaining a reduced image of said mask.

11. An exposure apparatus according to claim 10, further comprising:
- a detector for obtaining from said alignment optical system reference information related to said alignment light emitted from said second light source and measurement information related to reflected light of said alignment light emitted toward the alignment marks provided on said mask and on said substrate, respectively, and detecting a positional deviation between the alignment mark on said mask and the alignment mark on said substrate, based on the reference information and measurement information;
- a stage driver for driving said stage so as to move said substrate in parallel with said first plane; and a control system for controlling movement of said stage driver in order to adjust a relative position between said mask and said substrate, based on information on the positional deviation obtained from said detector.

12. An exposure apparatus according to claim 10, further comprising a dichromic mirror which reflects said exposure light but transmits said alignment light, said dichromic mirror being set between said first and second planes so as to direct said exposure light to said mask.

13. An exposure apparatus according to claim 12, wherein said dichroic mirror is set between said variable optical system and said second plane.

14. An exposure apparatus according to claim 12, wherein said dichroic mirror is set between said variable optical system and said first plane.

15. An exposure apparatus according to claim 10, wherein said variable optical system is a Galilean optical system comprising a positive lens group set between said first and second planes and a negative lens group set between said positive lens group and second plane.

16. An exposure apparatus according to claim 15, comprising a dichromic mirror which reflects said exposure light but transmits said alignment light, said dichromic mirror being set between said positive lens group and negative lens group so as to direct said exposure light to said mask.

17. An exposure apparatus according to claim 15, wherein at least a pair of objective lenses are provided on said second plane and said exposure apparatus comprises at least one pair of alignment optical systems corresponding to said objective lenses; and wherein said Galilean optical system is defined as follows:

$h < (1-K)^{-1} \{ (y/(2\beta \cdot NA)) \cdot (1-f_1/L) - (\beta^{-1}-1) \cdot f_1 \}$ $K = y/(2\beta L \cdot NA)$ $f_2 = -\beta f_1/(1+((h-f_1)/L))$ $d = f_1(1-\beta+h/L)/(1+((h-f_1)/L))$ where h: a distance between said mask and the principal plane of said positive lens group;

y: a distance between said objective lenses;

NA: a numerical aperture of said objective lenses;

$\beta$: a reduction ratio ($0<\beta<1$) of said Galilean optical system;

$f_1$: a focal length of said positive lens group;

$f_2$: a focal length of said negative lens group;

L: a distance between said mask and a pupil of said projection optical system;

d: a principal plane separation between said positive lens group and said negative lens group.

18. An exposure apparatus according to claim 10, wherein said variable optical system is a Keplerian optical system comprising a first positive lens group set between said first and second planes and a second positive group set between said first positive lens group and said second plane.

19. An exposure apparatus according to claim 18, comprising a dichromic mirror which reflects said exposure light but transmits said alignment light, said dichromic mirror being set between said first and second planes so as to direct said exposure light to said mask.

20. An exposure apparatus according to claim 18, wherein said variable optical system further comprises a stop provided between said first and second positive lens groups.

21. An exposure apparatus according to claim 18, wherein said variable optical system further comprises an optical path splitting member provided in an optical path between said first and second positive lens groups.

22. An exposure apparatus according to claim 10, wherein the wavelength of said exposure light is the same as that of said alignment light.

23. An exposure apparatus according to claim 10, further comprising a mask exchange system having a mask driver for moving said mask.

* * * * *